United States Patent
Gale et al.

[11] 3,944,420
[45] Mar. 16, 1976

[54] GENERATION OF PERMANENT PHASE HOLOGRAMS AND RELIEF PATTERNS IN DURABLE MEDIA BY CHEMICAL ETCHING

[75] Inventors: Michael Thomas Gale, Gattikon; James Kane, Affoltern am Albis, both of Switzerland

[73] Assignee: RCA Corporation, New York, N.Y.

[22] Filed: May 22, 1974

[21] Appl. No.: 472,350

[52] U.S. Cl. .................. 96/36; 96/27 H; 96/38.3; 156/13; 350/3.5
[51] Int. Cl.² ............................................. G03C 5/00
[58] Field of Search ....... 96/27 H, 38.3, 36; 156/13; 350/3.5

[56] References Cited
UNITED STATES PATENTS

| | | | |
|---|---|---|---|
| 1,922,434 | 8/1933 | Gundlach............................. | 96/38.3 |
| 3,489,624 | 1/1970 | Lake et al............................ | 156/15 |
| 3,539,408 | 11/1970 | Cashan et al. ....................... | 156/4 |
| 3,573,948 | 4/1971 | Tarnopol ............................. | 117/5.5 |
| 3,580,657 | 5/1971 | Sheridon............................. | 350/3.5 |
| 3,667,946 | 6/1972 | Sturdevant.......................... | 96/27 H |
| 3,669,673 | 6/1972 | Ih et al................................ | 96/27 H |
| 3,680,945 | 8/1972 | Sheridon............................. | 96/27 H |
| 3,787,213 | 1/1974 | Gervay et al. ....................... | 96/36 |

OTHER PUBLICATIONS
Hanak, J. J. et al., "Permanent Holograms in Glass by R. F. Sputter Etching", RCA Review, Vol. 32, June 1971, pp. 319–323.
Magill, P. J. et al., "J. Electrochem. Soc. : Solid State Science" Vol. 118, No. 9, pp. 1514–1516, Sept. 1971.

*Primary Examiner*—Ronald H. Smith
*Attorney, Agent, or Firm*—Edward J. Norton; George J. Seligsohn

[57] ABSTRACT

A surface relief pattern, e.g. a surface relief hologram, is substantially linearly transferred to a hard durable substrate, capable of being used as a medium for permanent storage of the pattern or as a master for replicating the hologram, from a photoresist coated on the substrate, by exposing the photoresist and the substrate to a photoresist developer bath and a chemical bath capable of etching the substrate at a rate substantially proportional to the development rate of the photoresist. This technique allows the transfer of surface relief patterns with dimensions on the order of one micron or less, and is applicable to the formation of surface relief holographic patterns in permanent media for archival storage and to making master surface relief holograms.

9 Claims, 5 Drawing Figures

GENERATION OF PERMANENT PHASE HOLOGRAMS AND RELIEF PATTERNS IN DURABLE MEDIA BY CHEMICAL ETCHING

FIELD OF THE INVENTION

The present invention relates to a method for transferring a surface relief pattern recorded in a photoresist onto an underlying substrate. More particularly, the present invention relates to a method for substantial linear transfer of a surface relief phase hologram recorded on a photoresist from the photoresist to a hard durable substrate, capable of being used as a permanent medium for archival storage or capable of forming a master for replicating said hologram, by chemical etching.

BACKGROUND

Because conventional microfilm and microfiche recorded in photographic material deteriorate with time, it is desireable to record information for archival storage on a permanent medium. A surface relief pattern, e.g., a surface relief focused image hologram, provides such a permanent medium since it can be recorded on hard durable materials, e.g., glass, metal films and thermoplastics. Also, it is desireable to form a master capable of replicating surface relief holograms in a permanent material. Since conventional photoresists are relatively soft materials, a surface relief hologram formed in a photoresist must be transferred to a more durable material before it can be used as a permanent medium for archival storage or before it can be used as a master to replicate the surface relief pattern in a permanent material. The resolution required for the typical surface relief hologram is on the order of 1 micron. This high resolution necessitates that the transfer of a surface relief pattern from a photoresist to the material which is to form a master be accomplished with precision. The conventional technique for forming a master for a surface relief hologram is to deposit a metal film or hardenable material on the resist surface and separate the film from the photoresist surface. The film may be backed with a hard material for support. Great care must be exercised in separating the film from the photoresist to prevent damage to the surface relief pattern embossed on the film. U.S. Pat. No. 3,565,978 describes such a technique.

Until the present invention, it was possible to transfer a hologram recorded on a photosensitive surface layer covering a hard durable substrate material to the substrate material itself only by sputter-etching, as described in U.S. Pat. No. 3,773,258. "Conventional" etching techniques do not work well because the substrate can only be etched if it is revealed and if the substrate is only partially revealed after a single resist development, as in conventional etching techniques, the etch will not give a substantially linear transfer of the surface relief pattern. Sputter-etching is less efficient and less economical than chemical etching. Thus, it is desirable to develop a method for substantial linear transfer of a surface relief pattern recorded in a photoresist to an underlying hard durable substrate capable of forming a master hologram by chemical etching.

SUMMARY OF THE INVENTION

In accordance with the present invention, it has been discovered that an exposure pattern recorded on a photoresist as a surface relief pattern may be substantially linearly transferred to an underlying substrate material by contacting the photoresist and the substrate with a photoresist developer bath which developes said photoresist and a substrate etch bath which etches said substrate at substantially proportional rates. The photoresist developer bath and the substrate etch bath may be separate baths or the developer and the etch may be contained in a single bath. If the developer and the etch are in separate baths, the linear transfer takes place by alternately contacting the photoresist and substrate with the baths. The proportional development rate and etch rate can be achieved by varying the concentration of the developer and etch and by varying the baking time of the photoresist. This method may be used to transfer any type of surface relief pattern onto an underlying substrate.

DESCRIPTION OF PREFERRED EMBODIMENT

Figure 1:
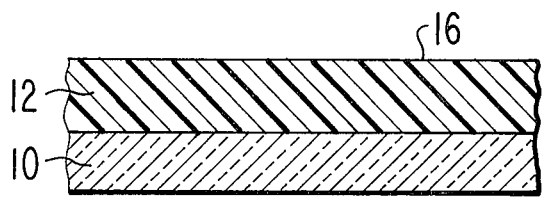
FIGS. 1–5, inclusive, illustrate the sequence for transfer of a sinusoidal surface relief pattern recorded on a photoresist onto a substrate by chemical etching.

As illustrated in FIG. 1, a substrate 10 is coated with a photoresist 12. An example of such a photoresist is a positive working photoresist, e.g. a Shipley AZ 1350 positive photoresist. The Shipley AZ 1350 is available from the Shipley Company. The resist film thickness should be about 5000 A. The film thickness typically may vary from 3000 to 10,000 A and should be uniform to about ± 100 A. A variety of substrate materials may be used for the substrate 10 including glass and thin metal or metal oxide films about 1 μm thick deposited on a substrate. The substrate material is preferably an amorphous material that will etch uniformly so as to avoid the development of an irregular pattern in the surface relief.

Figure 2:
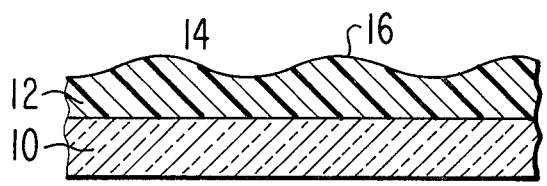

After prebaking, e.g. at a temperature of about 75°C. for 1 hour, the resist film 12 is exposed to the exposure pattern for a period of time. The term exposure pattern is defined as a spatial distribution of wave energy in accordance with a predetermined information pattern, e.g. a focused image holographic interference pattern, a fine detail grey pictorial pattern, etc. The photoresist 12 is normally developed in a developer bath, e.g. a Shipley AZ 303 developer available from the Shipley Company, to produce a surface relief pattern 14 which manifests the exposure pattern as variations in the relief of the exposed surface 16 of the photoresist 12. FIG. 2 illustrates a normally developed surface relief pattern 14 recorded on the surface 16 of photoresist 12. (For simplicity a sinusoidal illumination intensity pattern is assumed and the size of the surface relief pattern is greatly exaggerated.)

To transfer the surface relief pattern 14 from the surface 16 of the photoresist 12 onto the underlying substrate 10 further development is carried out by alternate immersion of the substrate 10 and the photoresist 12 in a linear photoresist developer bath and a suitable substrate etch bath. When using this procedure the photoresist developer should be inert with respect to the substrate and the substrate etch should be inert with respect to the photoresist.

Figure 3:
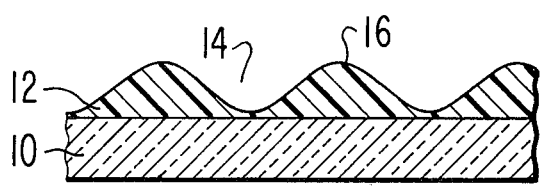
Figure 4:
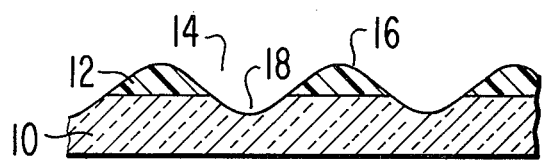
Figure 5:
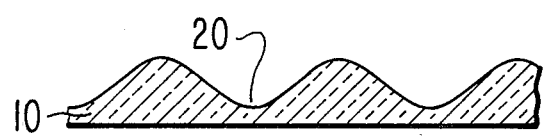

In each cycle the time in the resist developer bath is chosen to be a small fraction of the total time required in a conventional development procedure. The shorter the cycle and the greater the number of processing cycles the better the transfer characteristics. A cycle of about 10% of the normal time required to fully develop the exposure pattern gives a satisfactory transfer. The initial development cycles serve to further develop the relief pattern 14 in the photoresist 12. FIG. 3 illustrates the continued development of the photoresist 12. With further development the photoresist 12 is developed through to the substrate 10 at which point etching of the substrate 10 by the substrate etch commences. Referring now to FIG. 4, for a substantially linear transfer the depth of the revealed substrate 18 etched away during each cycle should be equal to the average depth of the photoresist 12 removed per cycle. This depth for a linear resist developer is equal to the depth of the resist removed per cycle for resist exposed at one half of the maximum exposure. Other transfer characteristics may be achieved by using different substrate etch concentrations and times. The development cycle is continued until all the resist 12 has been removed, leaving a surface relief pattern 20 in the substrate 10. FIG. 5 illustrates the relief pattern 20 etched into the substrate 10. Since the photoresist developer is inert to the substrate etch the cycle of alternate exposure to a developer bath and a substrate etch bath can commence after the initial exposure of the photoresist to the interference pattern; it is not necessary to first fully develop the intensity pattern as a surface relief pattern on the photoresist before starting the cycle. It is preferred that the photoresist and substrate be rinsed between contacts with the photoresist bath and the substrate etch bath.

A single bath can be employed if the resist developer and the substrate etch are compatible. The developer and the substrate etch concentrations are independently chosen to give the required substantially proportional development and etch rates. The etch rate for the resist and the substrate also may be matched by varying the length of the resist bake. The longer the resist bake the slower the development rate of the resist. The resist generally should be baked at from about 70°C. to about 80°C. and for a time from about one-half to about four hours. Substrate etching begins as soon as the substrate is revealed.

When using glass substrates problems are often encountered due to a lack of adhesion between the resist and the glass substrate. To solve this problem an intermediate thin metal film, e.g. chromium, can be deposited on the glass substrate prior to coating the substrate with the photoresist. The thin metal film is about 500 A thick. The intermediate film binds the photoresist and the glass substrate together. The film will nott significantly affect the development process if a suitable film etch, e.g. ceric sulphate in sulphuric acid for chromium films, is included in each cycle so the metal film is immediately removed upon exposure to the film etch.

The present invention will be further illustrated by the following examples, but it is to be understood that the invention is not meant to be limited to the details described therein.

The examples were made with the following holographic patterns:

a. A diffraction grating — a sinusoidal intensity pattern of constant modulation and a periodicity in the region of 2 – 10 $\mu$m; and b. A focused image hologram - a sinusoidal intensity pattern of varying modulation giving an image grey scale.

The techniques are applicable to square wave intensity patterns, e.g. exposure by contacting printing through a diffraction grating mask, and to holograms of the Fraunhofer and Fresnel types.

EXAMPLE I

A 500 A thick chromium film was evaporated onto a glass plate and coated with a 5000 A thick layer of Shipley 1350 photoresist by spinning the glass plate at about 3000 rpm for 30 seconds. The photoresist was baked for 1 hour at 75°C. Then the photoresist was exposed to a holographic intensity pattern from a He-Cd laser with a wavelength of 4416 A and an optimum exposure of about 0.1 joule/cm$^2$. The hologram was transfered onto the glass plate using the following cycle:

1. 15 seconds in a Shipley AZ 303 developer diluted 1:8 with distilled water;

2. 60 seconds in a chromium etch, i.e. a solution of 25 cc of concentrated sulphuric acid, 500 cc of water and 50 gms ceric sulphate. (All the revealed chromium is removed by this step); and 3. 15 seconds in a glass etch, i.e. a 4% aqueous solution of hydrofluoric acid.

The exact etching time can be varied for optimization of the transfer. The substrate was rinsed between baths with water. The cycle was repeated untill all the resist and chromium film had been removed. (Approximately 10 to 15 cycles were necessary for complete removal of the resist and chromiumm film.) Removal of any remaining photoresist and chromium outside the hologram area was accomplished using acetone or a resist remover and the chromium etch. The glass substrate was rinsed in water and dried.

EXAMPLE II

A glass plate was coated with an iron oxide film about 1 $\mu$m thick. The photoresist was deposited onto the coated plate, baked and exposed as described above in Example I. The hologram was transferred onto the iron oxide coating using the following cycle:

1. 15 seconds in a Shipley AZ 303 resist developer diluted 1:8 with distilled water; and 2. 15 seconds in an iron oxide etch comprisng 775 cc of concentrated hydrochloric acid, 223 cc of water, and 166 gms of ferrous chloride.

The cycle was repeated until all the resist was removed. The iron oxide should not be etched through to the glass substrate. The exact etching time can be varied for optimization of the transfer.

In the following single bath procedures the exposed plate was simply immersed in a developer which would etch both the resist and substrate for a given time during which the development stages shown in FIGS. 1–5 occurred.

EXAMPLE III

A 1 $\mu$m thick film of aluminum was evaporated onto a glass plate in a 1 millitorr oxygen atmosphere. An aluminum film evaporated in this manner may be etched in a sodium hydroxide solution which is the basis of the Shipley resist developer. The photoresist was deposited, baked and exposed as described in Example I. Development was carried out in a Shipley AZ 303 developer at a 1:8 dilution for about 3–4 minutes until all the resist was removed. The etch rates for the resist and the aluminum film are comparable and may be matched by varying the length of the resist bake to change the development rate of the resist, i.e. the longer the bake the slower the development rate of the resist. The plate was rinsed and dried.

EXAMPLE IV

A 1 μm thick film of chromium was deposited onto a glass substrate. A Shipley AZ 1350 photoresist was deposited, baked and exposed as described above in Example I. Development took place in a solution of 100 cc of Shipley AZ 303 Developer, 800 cc of water and 250 gms of potassium ferricyanide. The development time was 3–4 minutes. The resist and chromium etch rates are matched by varyin g the resist baking time and the etch component concentration. The plate was rinsed in water and dried.

What is claimed is:

1. A method for transferring a spatially-distributed, continuously-variable exposure pattern recorded on the surface of a substantially uniform layer of photoresist on a substrate into a corresponding surface relief pattern on the surface of the substrate itself underlying the photoresist, in which the amplitude on the surface relief pattern at any given point on said surface of said substrate is a function of the amount of exposure of said exposure pattern at the point on said surface of said photoresist which corresponds with that given point, said method comprising the following steps:
    a. contacting said exposure pattern with a solution including a photoresist developer which dissolves said photoresist at a rate which is a function of the amount of exposure thereof and with a solution including a substrate etch which etches any revealed portion of said substrate surface at a given rate so that initiation of substrate etching of an earlier-revealed substrate surface portion precedes initiation of substrate etching of a later-revealed substrate surface portion, and
    b. terminating step a) substantially at a certain time when said photoresist has been completely dissolved.

2. The method of claim 1 wherein said substrate is a hard durable substrate capable of forming a master for replicating said surface relief pattern.

3. The method defined in claim 1, wherein step a) comprises the steps of:
    c. contacting said exposed pattern alternately with a first solution including said photoresist developer for a first time which is a fraction of said certain time, said substrate being inert to said photoresist developer, and with a second solution including said substrate etch for a second time which is a fraction of said certain time, said photoresist being inert to said substrate etch.

4. The method of claim 3 wherein the time period for said alternate contact of said photoresist to said developer and said substrate to said etch is less than the time required for full development of said photoresist as a surface relief patten on said photoresist.

5. The method of claim 4 wherein said time is no more than about 10% the time required for full development of the surface relief pattern on said photoresist.

6. The method defined in claim 3, wherein step c) includes a plurality of cycles of said alternate contacting of said exposed pattern with said first and second solutions within said certain time.

7. The method of claim 1 wherein said substrate etch concentration and said developer concentration are varied so the development rate of said photoresist is equal to the etch rate of said substrate.

8. The method of claim 1 wherein said photoresist is baked following deposition on said substrate at a temperature between about 70° to 80°C. for a time of about ½ to four hours so that the said photoresist is developed by said developer at a rate substantially equal to the rate at which said substrate etch etches said substrate.

9. The method defined in claim 1, wherein said substrate is composed of a material which is etched by photoresist developer, and wherein step a) comprises contacting said exposure pattern with a single solution including a photoresist developer which also operates as said solution including a substrate etch.

* * * * *